Figure 4:
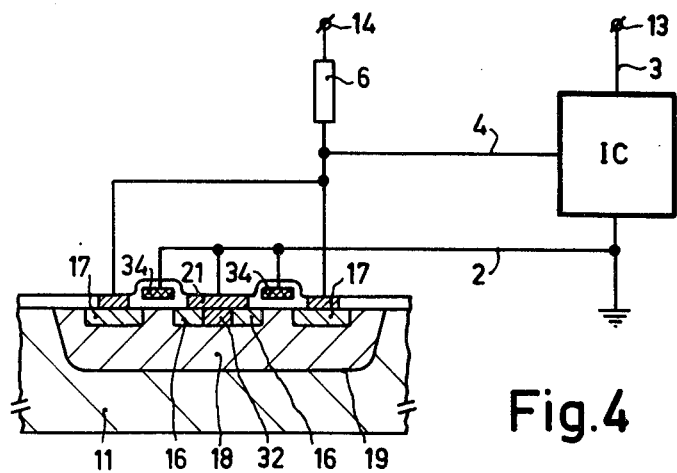

United States Patent [19]

Daub et al.

[11] 4,131,908

[45] Dec. 26, 1978

[54] SEMICONDUCTOR PROTECTION DEVICE HAVING A BIPOLAR LATERAL TRANSISTOR

[75] Inventors: Dirk Daub; Olof E. H. Klaver, both of Nijmegen, Netherlands

[73] Assignee: U.S. Philips Corporation, New York, N.Y.

[21] Appl. No.: 767,569

[22] Filed: Feb. 10, 1977

[30] Foreign Application Priority Data

Feb. 24, 1976 [NL] Netherlands ...................... 7601843

[51] Int. Cl.² ........................................... H01L 27/02
[52] U.S. Cl. ......................................... 357/42; 357/23;
357/34; 357/35; 357/43; 361/57; 307/205
[58] Field of Search ..................... 357/13, 42, 43, 49,
357/68, 34, 23, 35; 307/202 R, 205

[56] References Cited

U.S. PATENT DOCUMENTS

| | | | |
|---|---|---|---|
| 3,628,070 | 12/1971 | Heuner | 357/42 |
| 3,636,385 | 1/1972 | Koepp | 357/42 |
| 3,673,428 | 6/1972 | Athanas | 357/42 |
| 3,739,238 | 6/1973 | Hara | 357/42 |
| 3,764,864 | 10/1973 | Okumura et al. | 357/42 |
| 3,821,780 | 6/1974 | Harland et al. | 357/68 |
| 3,918,080 | 11/1975 | Kerr | 357/68 |
| 3,967,295 | 6/1976 | Stewart | 357/42 |

*Primary Examiner*—Andrew J. James
*Attorney, Agent, or Firm*—Thomas A. Briody; Steven R. Biren

[57] ABSTRACT

A safeguarded integrated circuit includes two supply electrodes, an output electrode and an input electrode. Between two of the electrodes there is provided a protection circuit having a lateral bipolar transistor, the emitter and collector zones of which are connected respectively to the said electrodes. The bipolar transistor is provided in a region which is surrounded by the substrate which region serves as a base zone and has a conductivity type opposite to that of the substrate. A connection contact connected to the emitter is provided on this region and a modulatable resistance is formed between the connection contact and the active base zone by the region.

12 Claims, 10 Drawing Figures

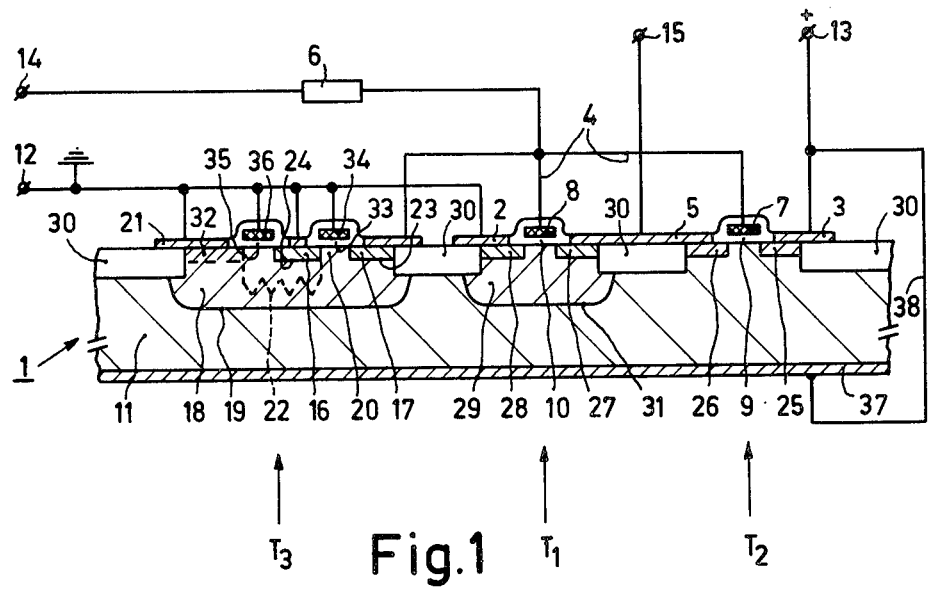
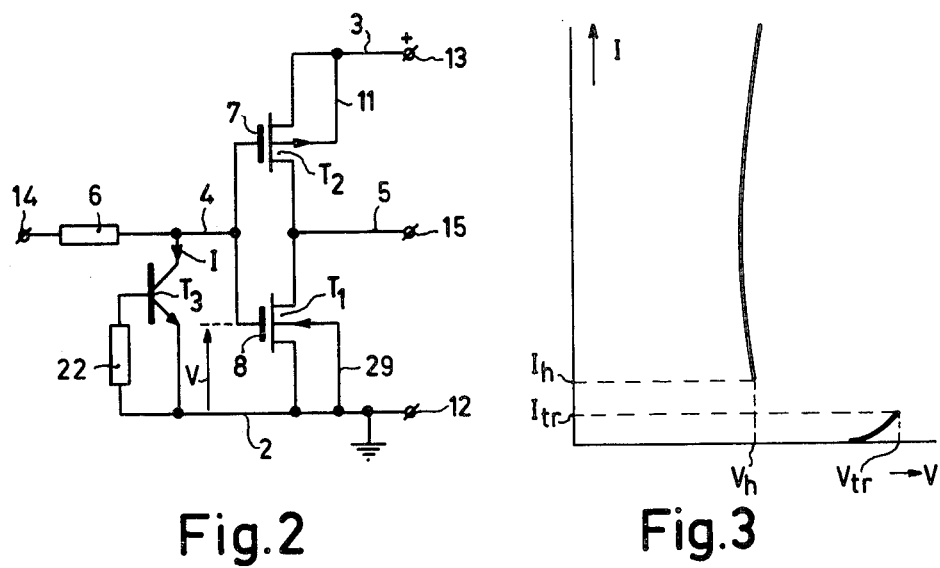
Fig.1  Fig.2  Fig.3

SEMICONDUCTOR PROTECTION DEVICE HAVING A BIPOLAR LATERAL TRANSISTOR

The invention relates to a semiconductor device having a semiconductor body comprising an integrated circuit having at least two supply electrodes, an input electrode and an output electrode, in which there is present between a first and a second of these electrodes a protection circuit having a bipolar lateral protection transistor which is formed by emitter and collector zones of a first conductivity type which adjoin a surface of the semiconductor body and which are provided in and surrounded by a surface-adjoining base region of the second conductivity type, which base region comprises a connection contact so that a resistor formed by a part of the base region is present in the current path of said connection contact to the active base zone situated between the emitter and collector zones, the emitter zone, the connection contact, and the said first electrodes being connected together electrically and the collector zone being connected electrically to the said second electrode, A semiconductor device as described above is known from British Patent Specification 1,337,220. In this known device the base region is formed by a substrate of the second conductivity type, in which the further elements of the integrated circuit are also provided.

One of the drawbacks of this known device is that, when the protection transistor is switched on and off, the potential variation of the active base zone of said transistor are transferred directly to the substrate and can be transmitted, via said substrate, to other circuit elements, which in many cases is undesirable.

Another drawback of this known device is that one is not free in the choice of the base doping of the protection transistor which, as a matter of fact, is determined by the substrate doping for the choice of which factors other than the properties of the protection transistor are decisive. As a result of this the substrate region often has such a low doping that the protection transistor becomes effective only at too high a voltage.

From U.S. Pat. No. 3,739,238 a semiconductor device is known in which breakdown between the gate electrode and the underlying substrate of an IGFET, either during operation or by charging during manipulating, is avoided by the presence of a bipolar protection transistor the emitter of which is connected to the gate electrode, while both the collector of the bipolar transistor and the source electrode of the field effect transistor are connected to the earthed supply electrode, the base of the bipolar transistor having no connection and hence being at a floating potential.

In this case, breakdown occurs between the emitter and the collector with floating base, the differential resistance after breakdown in both directions being very small.

However, a protection transistor having a floating base involves an important drawback. The transition from the non-conductive to the conductive state in a bipolar transistor having a floating base actually occurs already at a very small current through the transistor, the "switching-on current", while in addition, after the transistor has become conductive due to the occurrence of said breakdown, the minimum current which is necessary to keep the transistor in the conductive state, the "switching-off current", is very small. As a result of this, on the one hand the protection often becomes operative too easily, while on the other hand after operation of the protection circuit and after termination of the necessity thereof, the transistor sometimes does not revert automatically to the non-conductive state and can be made non-conductive only with difficulty.

One object of the invention is to provide a semiconductor device having an integrated circuit comprising a protection against excess voltages between two electrodes, in which the differential resistance of the protection circuit in the conductive state is very low in both directions.

Another object of the invention is to provide an integrated circuit having a protection circuit which does not become operative too easily, which protection circuit, after the disappearance of the excess voltage, automatically and rapidly returns to the original, non-conductive state.

For that purpose, a semiconductor device of the kind described in the preamble is characterized according to the invention in that the base region is surrounded entirely within the semiconductor body by a surface-adjoining substrate region of the first conductivity type which forms a p-n junction with the base region.

It is to be noted that, within the scope of this application, when there is reference to the emitter zone and the collector zone of the said bipolar transistor, the collector zone is to be understood to mean that one of the said surface-adjoining zones of the first conductivity type whose p-n junction with the base zone at the normal operating voltages of the integrated circuit is biased in the reverse direction.

The semiconductor device according to the invention comprises a protection circuit which in the conductive state shows a very low differential resistance for both directions of the voltage across it. A further important advantage of a device having a protection circuit according to the invention is that the current at which the protection circuit switches from the non-conductive into the conductive state, as well as the minimum current at which the protection circuit can remain in the conductive state, are not unacceptably small and can be controlled within certain limits by a suitable choice of the geometry of the device. Since the p-n junction between the base region and the substrate region does not trigger the protection circuit but can always be kept at a substantially fixed reverse voltage, the potential of the substrate region and of the further zones provided therein experience a smaller influence from the switching on and off of the protection circuit. Since furthermore the part of the base region between the connection contact and the active base zone forms a shunt resistance across the p-n junction between the emitter zone and the base region, the switching on and off currents will both be larger than when the base of the transistor is at floating potential.

When a voltage in the reverse direction occurs between the connection contact on the base region and the collector zone, the p-n junction between the base region and the collector zone being biased in the forward direction, the protection circuit operates as a p-n diode in the forward direction, in series with a resistance formed by the base region between the connection contact and the collector zone. However, said resistance is generally negligibly small as a result of conductivity modulation due to the large amount of minority charge carriers injected into the base region from the collector zone. Thus the protection operates in both directions.

The protection circuit according to the present invention can advantageously be used for the protection against excess voltages between a supply electrode and the input of an integrated circuit. However, the device according to the invention can be used not only as an input protection but also as a protection between two arbitrary electrodes, preferably as a supply protection between two supply electrodes, in both cases naturally with suitable adaptation of the remaining circuit. In general the protection circuit according to the invention serves as a protection against excess voltages between the two electrodes between which the protection circuit is connected. In many cases said excess voltage can cause direct breakdown between the two said electrodes and the protection serves directly to avoid said direct break-down. In other cases, to the contrary, excess voltage between the two said electrodes will not cause damage between said electrodes but elsewhere in the circuit; in that case also a protection circuit connected between the two electrodes serves to avoid such damage. The protection circuit according to the invention can not only be used in circuits having insulated gate field effect transistors but, as will become apparent hereinafter, may also be used advantageously in circuits having, for example, junction field effect transistors ("junction FET's") and in bipolar circuits.

Figure 5:
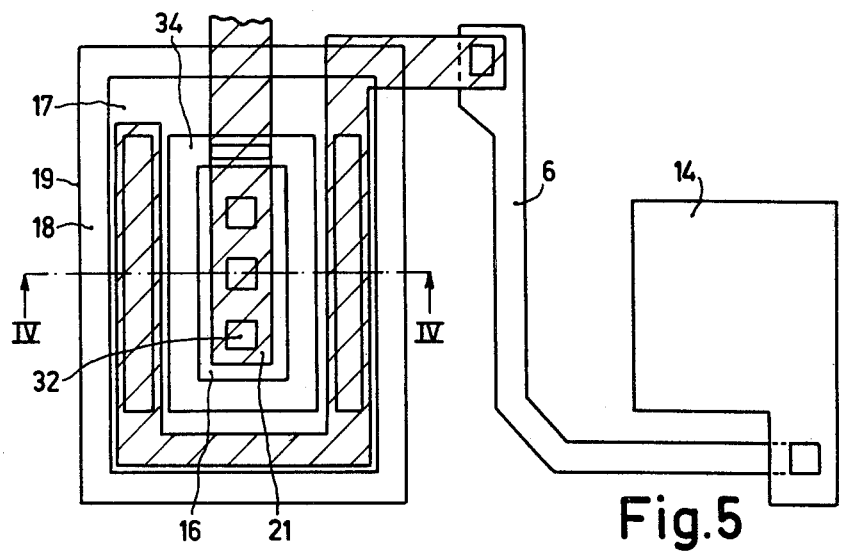
Figure 6:
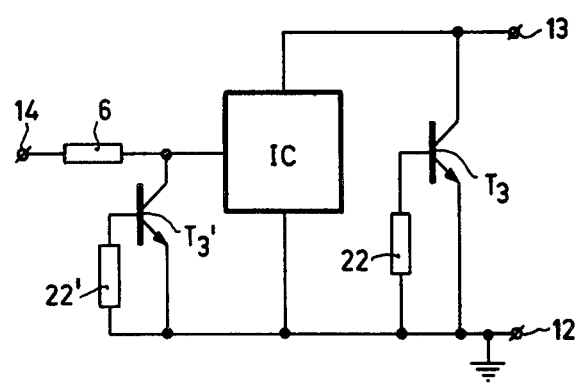
Figure 7:
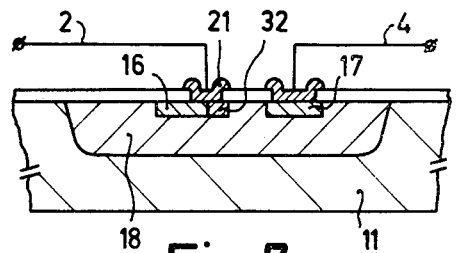
Figure 8:
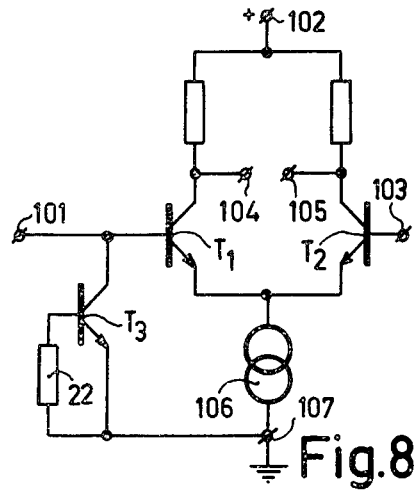
Figure 9:
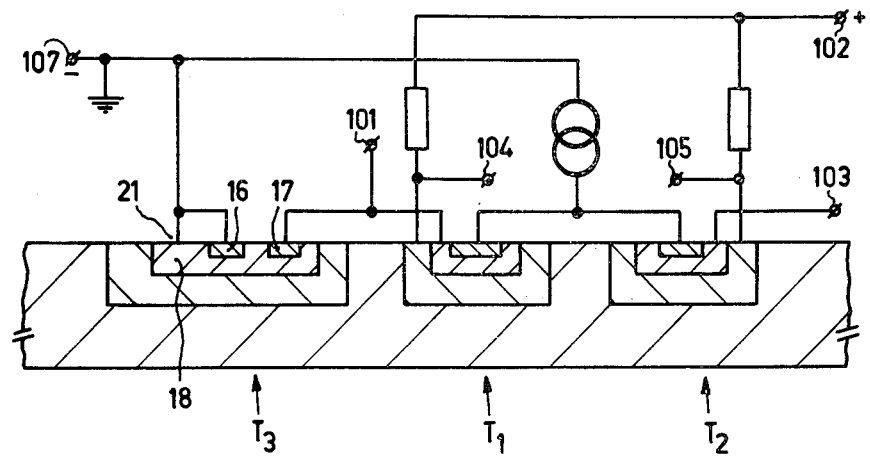
Figure 10:
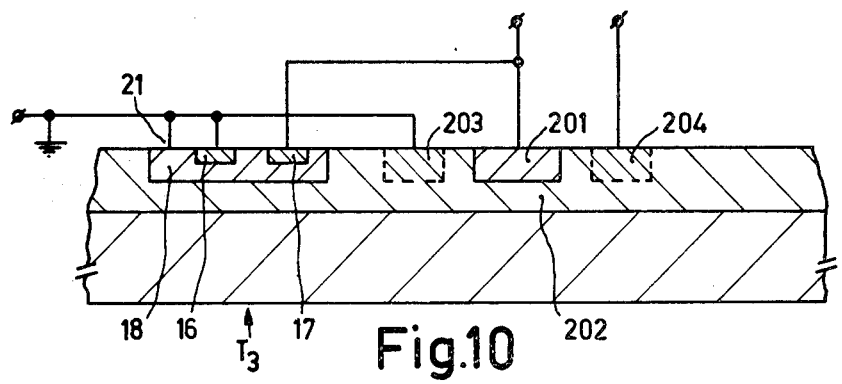

The invention will now be described in greater detail with reference to various embodiments and the drawing, in which:

FIG. 1 is a diagrammatic cross-sectional view of a device according to the invention, FIG. 2 shows the circuit diagram corresponding to the device shown in FIG. 1, FIG. 3 illustrates diagrammatically the current-voltage characteristic of the protection circuit of the device shown in FIGS. 1 and 2, FIG. 4 shows diagrammatically partly a cross-sectional view and partly a circuit diagram of another embodiment of the device according to the invention, FIG. 5 is a plan view of the device shown in FIG. 4, FIG. 6 shows diagrammatically the circuit diagram of a further device according to the invention, FIG. 7 is a diagrammatic cross-sectional view of again another embodiment of a device according to the invention, FIG. 8 shows the circuit diagram of a device according to the invention having a bipolar integrated circuit, FIG. 9 is a diagrammatic cross-sectional view of the structure of the device shown in FIG. 8, and FIG. 10 is a diagrammatic cross-sectional view of a device according to the invention having a junction field effect transistor.

The figures are diagrammatic and not drawn to scale. In the cross-sectional views semiconductor regions of the same conductivity type are shaded in the same direction. Corresponding parts in the various embodiments are as a rule referred to by the same reference numerals.

FIG. 1 is a diagrammatic cross-sectional view of a semiconductor device according to the invention, the circuit diagram of said semiconductor device being shown in FIG. 2. The semiconductor device according to this embodiment has a semiconductor body 1 of silicon which comprises an integrated inverter circuit having two complementary field effect transistors, an n-channel transistor $T_1$ and a p-channel transistor $T_2$ with insulated gate electrode, single-sided input protection being provided to prevent breakdown between the insulated gate electrodes and the underlying semiconductor surface via the intermediately located insulating layer. Such a breakdown may occur in the operating condition (in which a positive voltage with respect to connection terminal 12 is at the connection terminal 13), but it may also occur out of operation by static charging of the gate electrodes during handling.

The integrated circuit has a first supply electrode 2, a second supply electrode 3, an input electrode 4 and an output electrode 5, which electrodes are partly shown diagrammatically in FIG. 2 as lines but actually they all consist of conductive layers. The electrodes 2, 3 and 5 are connected directly to the connection terminals 12, 13 and 15, while on the contrary the input electrode 4 is connected to the input connection 14 via a series resistor 6 for reasons to be given hereinafter. The resistor 6 which is shown diagrammatically may be an external resistor but may also be a resistance layer, for example a layer of polycrystalline silicon, which is separated from the semiconductor surface by an insulating layer, or may be a diffused resistor or a resistor formed by ion implantation, respectively. The input electrode 4 comprises the mutually connected gate electrodes 8 and 7 of the complementary field effect transistors $T_1$ and $T_2$ which are separated from the semiconductor surface by insulating layers 10 and 9 of silicon oxide. The transistor $T_2$ is a p-channel transistor having p-type source and drain zones 25 and 26, the transistor $T_1$ is an n-channel transistor having n-type source and drain zones 28 and 27 which are provided in a p-type region 29 which is surrounded entirely by the n-type substrate region 11 and forms therewith a p-n junction 31. For the mutual separation of the transistors $T_1$, $T_2$ and $T_3$ a sunken oxide pattern 30 which surrounds the transistors entirely is used in known manner in this example. The presence of such a sunken oxide pattern, however, is not necessary. The region 11 is connected to the terminal 13 via a contact layer 37 and a conductor 38.

A protection circuit is present between a first and a second of the said electrodes. In this example there has been selected as the first electrode the supply electrode 2 which is connected to earth and as second electrode the input electrode 4. The protection circuit comprises a bipolar lateral safety transistor $T_3$ the emitter zone of which is connected to the supply electrode 2 and the collector zone is connected to the input electrode 4. This transistor is formed by emitter and collector zones (16, 17) of a first conductivity type, in this case n-type, which adjoin a surface of the semiconductor body and are provided in and surrounded by a surface-adjoining base region 18 of the second conductivity type, in this case the p-type. This base region 18 comprises a connection contact 21 so that a resistor (denoted by 22 in broken lines in FIG. 1) formed by a part of the base region 18 is present in the current path of the said connection contact 21 to the active base zone 20 situated between the emitter and collector zones (16, 17). The emitter zone 16, the connection contact 21, and the said first electrode 2 are connected together electrically, while the collector zone 17 is connected electrically to the said second electrode 4.

According to the invention, the base region 18 is surrounded entirely within the semiconductor body by a surface-adjoining substrate region 11 of the first conductivity type, in this case the n-type, which forms a p-n junction 19 with the base region 18.

The operation of the protection in the device described is based on the following. A voltage which may cause danger of breakdown of the gate electrode insulation layer may occur between the connection terminals 14 and 12 either during a peak at the input voltage or by charging during manipulating. When said voltage has such a polarity that as a result of this the p-n junction 23 between the collector zone 17 and the base region 18 is biased in the reverse direction, said p-n junction 23 will break down by an avalanche effect with a certain voltage is exceeded. The current which as a result of this flows between the collector zone 17 and the connection contact 21 through the base region 18 causes in the said region 18 a voltage drop across the resistance 22 so that a voltage in the forward direction is set up across the p-n junction 24 between the emitter zone 16 and the base region 18 and said junction 24 starts injecting charge carriers into the base region 18. As a result of this the bipolar transistor $T_3$ becomes conductive with a very low differential resistance as a result of the interaction between the gain of the transistor and the avalanche multiplication at the p-n junction 23 which is biased in the reverse direction.

FIG. 3 shows diagrammatically the current-voltage characteristic of the protection transistor $T_3$ in which the voltage V between the input electrode 4 and earth is plotted on the horizontal axis and the current I from the input electrode 4 to earth is plotted on the vertical axis. The switching off current ("hold current") $I_h$ and the switching off voltage ("hold voltage") $V_h$ at which after breakdown the protection circuit still remains just in the conductive state, and the trigger current $I_{tr}$ and trigger voltage $V_{tr}$ at which the protection becomes operative are also shown in FIG. 3. Otherwise this figure is only qualitative and serves only to show the general shape of the resulting V-I curve. The differential resistance (the value dI/dV) after breakdown is very small. The switching off current $I_h$ and the switching on current $I_{tr}$ are not very low as a result of the presence of the resistance 22 formed by a part of the base region 18, so that it is not difficult to bring the protection circuit again in the non-conductive state and at the same time the premature operation of the protection is counteracted.

In this example, a series resistor 6 is provided between the input electrode 4 and the external input connection 14 in order to promote the last-mentioned favorable properties of the protection circuit. When the value of said resistor 6 is equal to R, then in the state in which the transistor $T_3$ is still just in the conductive state, the voltage drop across said resistor is equal to $I_h \times R$, while the voltage between the input terminal 14 and earth then is $V_h + I_h \times R$. At a given value of $V_h$, R may be chosen to be so large that the voltage between terminal 14 and earth at which transistor $T_3$ is still just conductive is larger than the maximum supply voltage which is normally present between terminal 13 and earth. In that case, after the removal of the voltage peak at terminal 14, the protection circuit will automatically return to the non-conductive state.

When the voltage peak at electrode 4 has an opposite polarity, the protection circuit between the electrodes 2 and 4 operates as a diode in the forward direction (p-n junction 23) with a resistor in series. In accordance with the current which flows through the protection circuit, said resistance may become very small due to conductivity modulation as a result of electrons injected across the p-n junction 23 from the collector zone 17 into the base region 18. In order to obtain a series resistance which is as low as possible, the geometry will preferably also be adapted thereto. As shown in FIG. 1, in this example the connection contact is provided on a surface-adjoining p-type contact zone 32 belonging to the base region 18 and having a higher doping than the adjoining part of the region 18.

In order to prevent the formation of an inversion channel at the surface between the n-type zones 16 and 17, as a result of which the operation of transistor $T_3$ would be adversely influenced, a field electrode 34, for example of polycrystalline silicon, which is separated from the base region 18 by an insulating layer 33, for example of silicon oxide, is provided above the active base zone 20 of the lateral bipolar transistor $T_3$ and is D.C. connected to the emitter zone 16. In addition, in order to prevent possible variations in the resistor 22 as a result of a possible inversion layer between the contact zone 32 and the emitter zone 16, in this example a field electrode 36, for example of polycrystalline silicon, which is separated from the base region 18 by an insulating layer 35, for example of silicon oxide, is provided between the contact zone 32 and the emitter zone 16 and is also D.C. connected to the emitter zone 16. The presence of the field electrodes 34 and 36 is sometimes desired, but is not necessary.

If required, in order to reduce the resistance 22, the contact zone 32 will preferably be provided so as to adjoin the emitter zone 16 which is situated between the connection contact 21 and the collector zone 17. This is illustrated in FIG. 4 which shows only the cross-sectional view of the protection circuit, while the remainder of the integrated circuit is denoted diagrammatically by IC and the reference numerals correspond to those of FIG. 1. FIG. 4 shows furthermore a more symmetric construction of the protection circuit the plan view of which is shown in FIG. 5. In addition, in the example of FIGS. 4 and 5 the contact zone 32 and the emitter zone 26 are short-circuited at the surface by the metal layer 21. Furthermore, no sunken oxide pattern is used in the example shown in FIGS. 4 and 5.

In the examples described with reference to FIGS. 1 to 5, the emitter and collector zones 16 and 17 of the protection transistor $T_3$ are connected to two electrodes one of which is the supply electrode 2 connected to earth (or to a different reference potential), while the other electrode is the input electrode 4. In this manner an input protection is obtained. However, the protection transistor $T_3$ may also be connected so that the said "second" electrode is the supply electrode 3. In that case a supply protection is obtained against excess voltages between the connections 12 and 13. The circuit diagram then becomes, for example, as is shown in FIG. 6. In this case, however no series resistor should be used between the supply connection 13 and the safety transistor $T_3$ since the voltage drop over such a resistor is impermissible in a supply circuit. In order to nevertheless keep the minimum voltage at which the protection remains in the conductive state lower than the normal supply voltage so that after return to the normal state the protection returns again to the non-conductive state, the gain factor of the protectin transistor $T_3$ may be reduced, for example, by increasing the distance between the emitter and collector zones 16 and 17, so that also the difference between the voltages $V_h$ and $V_{tr}$ (FIG. 3) decreases considerably. In that case, however, the lateral transistor $T_3$ after breakdown of the collector-base junction cannot pass a high current. However, the protection is sufficient nevertheless, since it has been found that in this case the vertical transistor formed by the zones 16, 18 and 11 passes a large part of the current occurring after breakdown. This is a further important advantage of the invention as compared with the said British Patent Specification 1,337,220. Of course, this depends on the mutual distances of the p-n junctions 19, 23 and 24 and the dopings used, which quantities can all be chosen suitably by those skilled in the art in accordance with the prevailing conditions. In addition to the supply protection, an input protection (22', T₃') is provided in FIG. 6 as was described in the preceding examples.

As is shown diagrammatically in the cross-sectional view of FIG. 7, the connection contact 21 may also be provided between the zones 16 and 17. In that case the resistance 22 is formed by the spreading resistance of the connection contact 21 and the highly doped zone 32 possibly belonging thereto. In general, however, it will be desired to provide the emitter zone 16 between the collector zone 17 and the connection contact 21, as in the preceding examples, so as to obtain values of the switching on and off currents and voltages which are not too low but are not too high either. Combinations of these cases are also possible.

The bipolar lateral protection transistor T₃ having a reduced gain factor as shown in FIG. 6 may also be used advantageously at the input, preferably between the terminals 13 and 14. Due to the low gain factor the series resistor 6 may then be avoided since the switching on voltage $V_{tr}$ and the switching off voltage $V_h$ (see FIG. 3) differ only little in that case, while nevertheless the differential resistance remains very low. In this case also, a large part of the current can be received by the vertical transistor (16, 18, 11).

In the above examples there has been described the use of a protection circuit according to the invention to prevent breakdown between an insulated gate electrode and the underlying semiconductor surface. In practice this certainly is one of the most important cases in which the invention can be used advantageously. However, the invention is not restricted thereto as will be illustrated with reference to the following examples.

FIG. 8 shows the circuit diagram of a differential amplifier having an input electrode 101, supply electrodes 102, 103, 107, output electrodes 104 and 105 and a current source 106. When the voltage at the input terminal 101 becomes very strongly positive, a danger of breakdown of the emitter-base junction of transistor T₂ may occur since the said junction may then be polarized considerably in the reverse direction. Therefore, a protection circuit as described in the preceding examples and consisting of transistor T₃ and resistance 22 has been provided between the input electrode 101 and earth. In the diagrammatic cross-sectional view of FIG. 9 it is shown how such a circuit can be integrated.

Finally, in the diagrammatic cross-sectional view of FIG. 10 it is illustrated how the protection circuit as described in the preceding Examples with the lateral bipolar transistor T₃ can be used as a protection between the p-type gate region 201 and the n-type channel region 202 of a junction field effect transistor having n⁺ source region 203 and n⁺ drain region 204.

The invention is not restricted to the examples described but many variations are possible to those skilled in the art without departing from the scope of this invention. For example, the conductivity types of all semiconductor regions may simultaneously be replaced by their opposite types, while observing the polarities of the voltages to be applied which are determined by the given definition of the term collector zone. In general the invention can be applied not only to circuits having complementary MOS transistors, but to any integrated circuit, in particular also to a device comprising a semiconductor body having only one discrete insulated gate field effect transistor. Furthermore the invention is not restricted to a semiconductor device having a semiconductor body of silicon, but other suitable semiconductor materials, for example, germanium or $A_{III}B_V$ compounds, for example GaAs, may also be used. Furthermore, instead of silicon oxide, the insulation layers used may also be different insulating materials, for example $Al_2O_3$ or $Si_3N_4$, while furthermore the said gate and field electrodes may, for example, also be a metal instead of polycrystalline silicon.

What is claimed is:

1. A semiconductor device having a semiconductor body with a surface-adjoining substrate region of a first conductivity type and comprising an integrated circuit having at least two supply electrodes, an input electrode and an output electrode, in which there is present between a first and a second of the electrodes a protection circuit having a bipolar lateral protection transistor which is formed by emitter and collector zones of said first conductivity type and a surface-adjoining base region of a second conductivity type formed in said substrate region, said emitter and collector zones adjoining a surface of the semiconductor body and being provided in and surrounded by said surface-adjoining base region, which base region comprises a base connection contact so that a resistor formed by a part of the base region is present in the current parth from said base connection contact to the active base zone situated between the emitter and collector zones; the emitter zone, the base connection contact, and said first electrode being connected together electrically and the collector zone being connected electrically to said second electrode, and the base region being surrounded substantially entirely within the semiconductor body by the surface-adjoining substrate region of the first conductivity type which forms a p-n junction with the base region.

2. A semiconductor device as claimed in claim 1, wherein the input electrode comprises an insulated gate electrode.

3. A semiconductor device as claimed in claim 1 or, wherein the emitter zone is situated between the collector zone and the base connection contact.

4. A semiconductor device as claimed in claim 1, wherein the base connection contact is provided on a surface-adjoining contact zone of the second conductivity type which forms a part of the base region and has a higher doping than that of the adjoining part of the base region.

5. A semiconductor device as claimed in claim 4, wherein the contact zone adjoins the emitter zone.

6. A semiconductor device as claimed in claim 5, wherein the contact zone and the emitter zone are connected at the surface of the semiconductor body by a metal layer.

7. A semiconductor device as claimed in claim 1, wherein at least one of the said first and second electrodes is a supply electrode.

8. A semiconductor device as claimed in claim 1, wherein one of the said first and second electrodes is the input electrode.

9. A semiconductor device as claimed in claim 8, wherein a series resistor is provided between the input electrode and the external input connection.

10. A semiconductor device as claimed in claim 1, wherein the first and second electrodes are the supply electrodes.

11. A semiconductor device as claimed in claim 1, wherein a field effect transistor, the field electrode of which is separated from the base region by an insulating layer, is provided above the active base zone and is D.C. connected to the emitter zone.

12. A semiconductor device as claimed in claim 4, wherein the contact zone is spaced apart from the emitter zone, and a field electrode which is separated from the base region by an insulating layer is provided between the contact zone and the emitter zone and is D.C. connected to the emitter zone.

* * * * *

UNITED STATES PATENT AND TRADEMARK OFFICE
CERTIFICATE OF CORRECTION

PATENT NO. : 4,131,908
DATED : December 26, 1978
INVENTOR(S) : DIRK DAUB ET AL

It is certified that error appears in the above—identified patent and that said Letters Patent are hereby corrected as shown below:

Claim 3, line 1, delete "or"

Signed and Sealed this

First Day of May 1979

[SEAL]

Attest:

RUTH C. MASON
Attesting Officer

DONALD W. BANNER
Commissioner of Patents and Trademarks